United States Patent
Kakinuma et al.

(10) Patent No.: US 9,584,167 B2
(45) Date of Patent: Feb. 28, 2017

(54) WIRELESS COMMUNICATION SYSTEM, DISTORTION COMPENSATION DEVICE, AND DISTORTION COMPENSATION METHOD

(71) Applicant: FUJITSU LIMITED, Kawasaki-shi, Kanagawa (JP)

(72) Inventors: Kazuyoshi Kakinuma, Oota (JP); Takanori Iwamatsu, Nasushiobara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/745,053

(22) Filed: Jun. 19, 2015

(65) Prior Publication Data
US 2016/0028421 A1    Jan. 28, 2016

(30) Foreign Application Priority Data
Jul. 25, 2014  (JP) .................................. 2014-152112

(51) Int. Cl.
*H04K 1/02* (2006.01)
*H04B 1/04* (2006.01)

(52) U.S. Cl.
CPC ... *H04B 1/0475* (2013.01); *H04B 2001/0408* (2013.01); *H04B 2001/0425* (2013.01); *H04B 2001/0433* (2013.01)

(58) Field of Classification Search
CPC ................. H03F 1/3247; H03F 1/3294; H03F 2201/3233; H04L 27/368; H04L 25/03343; H04L 1/0003; H04L 1/0071; H04L 5/0007; H04L 1/0009; H04L 27/0008

USPC ................. 375/296, 295, 219, 316
See application file for complete search history.

(56) References Cited

U.S. PATENT DOCUMENTS

| | | |
|---|---|---|
| 2004/0047409 A1 | 3/2004 | Lee et al. |
| 2004/0198260 A1 | 10/2004 | Molisch et al. |
| 2005/0089125 A1 | 4/2005 | Zhidkov |
| 2007/0153884 A1* | 7/2007 | Balasubramanian . H03F 1/3247 375/221 |
| 2009/0309657 A1 | 12/2009 | Li et al. |

(Continued)

FOREIGN PATENT DOCUMENTS

| | | |
|---|---|---|
| JP | 2004-104781 A | 4/2004 |
| JP | 2004-248278 A | 9/2004 |

(Continued)

*Primary Examiner* — Zewdu Kassa
(74) *Attorney, Agent, or Firm* — Arent Fox LLP

(57) ABSTRACT

A wireless communication system including: a first communication device including: a processor configured to: compensate a distortion to a input signal based on a determined distortion compensation coefficient set, a amplifier configured to amplify the input signal to which the distortion is compensated, and a first antenna configured to: transmit the amplified signal to a second communication device, and receive a first feedback signal from the second communication device, the first feedback signal relating to an error that is detected in a received signal by the second communication device, the received signal corresponding to the transmitted signal, wherein a plurality of distortion compensation coefficient included in the determined distortion compensation coefficient set are adjusted based on the first feedback signal relating to the error that is detected in the received signal by the second communication device.

10 Claims, 23 Drawing Sheets

(56) References Cited

U.S. PATENT DOCUMENTS

| | | | | |
|---|---|---|---|---|
| 2010/0238993 A1* | 9/2010 | Huang | ............ | H04L 7/0337 375/233 |
| 2011/0187454 A1* | 8/2011 | Fudaba | ............ | H03F 1/3247 330/149 |
| 2015/0049843 A1* | 2/2015 | Reuven | ............ | H03F 1/3247 375/297 |

FOREIGN PATENT DOCUMENTS

| JP | 2004-320541 A | 11/2004 |
|---|---|---|
| JP | 2005-136995 A | 5/2005 |
| JP | 2005-286480 A | 10/2005 |
| JP | 2009-303225 A | 12/2009 |

* cited by examiner

WIRELESS COMMUNICATION SYSTEM, DISTORTION COMPENSATION DEVICE, AND DISTORTION COMPENSATION METHOD

CROSS-REFERENCE TO RELATED APPLICATION

This application is based upon and claims the benefit of priority of the prior Japanese Patent Application No. 2014-152112, filed on Jul. 25, 2014, the entire contents of which are incorporated herein by reference.

FIELD

The embodiments discussed herein are related to a wireless communication system, a distortion compensation device, and a distortion compensation method.

BACKGROUND

A wireless transmission device in a wireless communication system includes an amplifier that amplifies the power of a transmission signal. In the wireless transmission device, the amplifier is typically operated in the vicinity of a saturation area of the amplifier in order to increase power efficiency of the amplifier. However, when the amplifier is operated in the vicinity of the saturation area, a non-linear distortion is increased. Therefore, the wireless transmission device includes a distortion compensation device that compensates such a non-linear distortion in order to suppress the non-linear distortion and reduce the adjacent channel leakage ratio (ACLR).

One of the distortion compensation schemes used for the distortion compensation device is referred to as a "predistortion (hereinafter may be referred to as "PD") scheme". The distortion compensation device of the PD scheme suppresses a distortion of output of the amplifier by multiplying, in advance, a transmission baseband signal before input to the amplifier by a distortion compensation coefficient that has the reverse characteristic of the non-linear distortion of the amplifier and increases the linearity of the output of the amplifier. The signal that has been obtained by multiplying the transmission baseband signal by the distortion compensation coefficient through the multiplier may be referred to as a "PD signal". Therefore, the PD signal is a signal that has been distorted in advance in accordance with the reverse characteristic of the non-linear distortion of the amplifier before the signal is input to the amplifier.

For example, as in the distortion compensation device of the PD scheme in the related art, there is a device including a table that stores a plurality of distortion compensation coefficients, and reads, from the table, a distortion compensation coefficient corresponding to an address value in accordance with the power of a transmission baseband signal. In addition, the distortion compensation device adjusts the read distortion compensation coefficient using an "adjustment coefficient", and outputs the adjusted distortion compensation coefficient to the multiplier. In addition, the distortion compensation device performs feedback of a part of an output signal of the amplifier in the wireless transmission device, and detects, from the "feedback signal", a "distortion component" that appears outside the "transmission band (that is, a channel)" applied to the wireless transmission device. In addition, the distortion compensation device may adjust distortion compensation processing (for example, "correct (update) the above-described adjustment coefficient"), based on the detected "distortion component outside the transmission band".

Japanese Laid-open Patent Publication No. 2009-303225 is the related art.

SUMMARY

According to an aspect of the invention, a wireless communication system comprising: a first communication device including: a memory configured to store a plurality of distortion compensation coefficient sets, each of the plurality of distortion compensation coefficient sets including a plurality of distortion compensation coefficients for compensating distortion that occurs in signals amplified by an amplifier, each of the plurality of distortion compensation coefficient sets being associated with each of powers of signals, a processor configured to: measure a power of an input signal, determine a distortion compensation coefficient set from the plurality of distortion compensation coefficient sets stored in the memory, based on the measured power of the input signal, and compensate the distortion to the input signal based on the determined distortion compensation coefficient set, the amplifier configured to amplify the input signal to which the distortion is compensated, and a first antenna configured to: transmit the amplified signal to a second communication device, and receive a first feedback signal from the second communication device, the first feedback signal relating to an error that is detected in a received signal by the second communication device, the received signal corresponding to the transmitted signal; and the second communication device including: a second antenna configured to: receive the transmitted signal from the first communication device, and transmit the first feedback signal to the first communication device, wherein the plurality of distortion compensation coefficient included in the determined distortion compensation coefficient set are adjusted based on the first feedback signal relating to the error that is detected in the received signal by the second communication device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

However, in the above-described distortion compensation device in the related art, the distortion compensation processing is adjusted based on the "distortion component outside the transmission band" included in the feedback signal in the wireless transmission device, so that an impact on the communication quality (for example, bit error rate (BER)) of a wireless reception device (that is, a communicating party of the wireless transmission device mounted on the distortion compensation device) due to the distortion compensation processing is not considered. Therefore, it is probable that the communication quality in the wireless reception device is reduced due to the distortion compensation processing.

In addition, in the above-described distortion compensation device in the related art, the distortion compensation processing is adjusted based on the "distortion component outside the transmission band", so that it is probable that the accuracy of the "distortion compensation processing in the transmission band" is not improved. As a result, the communication quality in the wireless reception device may be reduced. It is probable that such a trend has been increasing due to the recent bandwidth widening.

The technology discussed herein is made in view of the above-described problem, and an object of the technology discussed herein is to provide a wireless communication system, a distortion compensation device, and a distortion compensation method by which the communication quality is improved.

Embodiments of a wireless communication system, a distortion compensation device, and a distortion compensation method discussed herein are described below in detail with reference to drawings. The wireless communication system, the distortion compensation device, and the distortion compensation method discussed herein are not limited to the embodiments. In addition, in the embodiments, the same symbol is assigned to configurations having the same function, and a repeated description is omitted herein.

First Embodiment

Outline of Wireless Communication System

Figure 1:
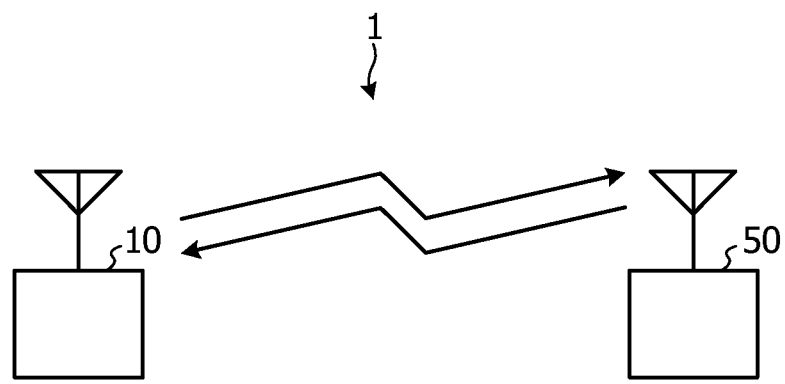
FIG. 1 is a diagram illustrating an example of a wireless communication system according to a first embodiment.

FIG. 1 is a diagram illustrating an example of a wireless communication system according to a first embodiment. In FIG. 1, a wireless communication system 1 includes a communication device 10 that amplifies the power of a transmission signal through an amplifier and transmits the signal using a "transmission band", and a communication device 50 that receives the signal that has been transmitted from the communication device 10. For example, one of the communication device 10 and the communication device 50 may be a wireless base station and the other communication device may be a wireless terminal device, and both of the communication devices may be wireless terminal devices. Hereinafter, the communication device 10 may be referred to as the "first communication device", and the communication device 50 may be referred to as the "second communication device".

For example, the communication device 10 has a "compensation coefficient table" that stores a plurality of distortion compensation coefficients that respectively correspond to a plurality of address values. In addition, the communication device 10 calculates an address value in accordance with a power value of a transmission baseband signal. In addition, the communication device 10 reads a distortion compensation coefficient corresponding to the calculated address value from the "compensation coefficient table". In addition, the communication device 10 adjusts the read distortion compensation coefficient using an "adjustment coefficient". In addition, the communication device 10 obtains a "PD signal" by multiplying the adjusted distortion compensation coefficient by the above-described transmission baseband signal, up-converts and amplifies the PD signal, and performs transmission of the PD signal.

The communication device 50 receives the signal that has been transmitted using a "transmission band" from the communication device 10, and calculates the "gap (that is, an error)" between the "reception signal point" of the received signal and the "expected signal point" coming from the received signal. In addition, the communication device 50 transmits information on the calculated "gap", to the communication device 10, as a "feedback signal".

The communication device 10 corrects (updates) the above-described "adjustment coefficient", based on the "feedback signal" from the communication device 50.

As described above, the communication device 10 may adjust the "adjustment coefficient", based on the "feedback signal" from the reception side device (that is, the communication device 50), obtained from the signal that has been actually transmitted using the "transmission band", so that the adjustment coefficient may be adjusted by reflecting the communication quality in the reception side device. In addition, the communication device 10 may adjust the "adjustment coefficient" based on the "feedback signal" from the reception side device (that is, the communication device 50), obtained from the signal that has been actually transmitted using the "transmission band", so that the accuracy of the "distortion compensation processing in the transmission band" may be improved.

[Configuration Example of First Communication Device]

Figure 2:
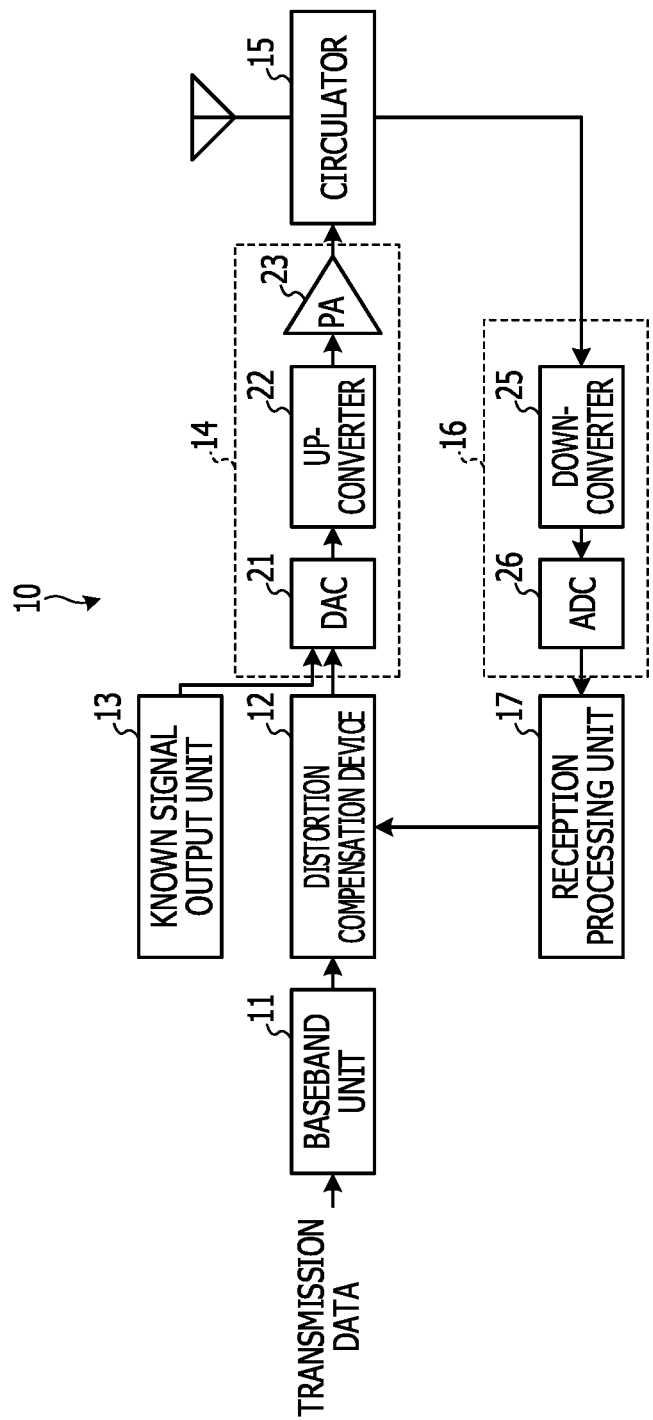
FIG. 2 is a block diagram illustrating an example of a first communication device according to the first embodiment.

FIG. 2 is a block diagram illustrating an example of the first communication device according to the first embodiment. In FIG. 2, the communication device 10 includes a baseband unit 11, a distortion compensation device 12, a known signal output unit 13, a wireless transmission unit 14, a circulator 15, a wireless reception unit 16, and a reception processing unit 17. In addition, the wireless transmission unit 14 includes a digital-to-analog converter (DAC) 21, an up-converter 22, and a power amplifier (PA) 23. In addition, the wireless reception unit 16 includes a down-converter 25 and an analog-to-digital converter (ADC) 26.

The known signal output unit 13 outputs a "known signal" at "certain timing". Here, the "known signal" includes "certain signal points" using the symbol s ("s" is a natural number) on a constellation diagram in accordance with the modulation scheme of the transmission baseband signal. In addition, the "known signal" has an amplitude corresponding to a non-linear domain of the PA 23. Thus, when the known signal is amplified in the PA 23, a non-linear distortion is superimposed over the known signal. In addition, the above-described "certain timing" corresponds to, for example, a sub-frame that has been defined in a frame in advance. That is, the known signal output unit 13 inserts the known signal into the transmission signal at the certain timing. Hereinafter, the above-described "known signal" may be referred to as a "calibration bit".

The baseband unit 11 executes baseband processing such as coding processing and modulation processing for the input transmission data, generates a transmission baseband signal In (t), and output the generated transmission baseband signal In (t) (may be referred as to "input signal") to the distortion compensation device 12.

The distortion compensation device 12 is a distortion compensation device of the PD scheme, and has a "compensation coefficient table" that stores a plurality of distortion compensation coefficients that respectively correspond to a plurality of addresses that respectively correspond to a plurality of power ranges. The distortion compensation device 12 reads a distortion compensation coefficient from the distortion compensation table, based on an address that has been generated in accordance with the power of the transmission baseband signal, with reference to the compensation coefficient table. In addition, the distortion compensation device 12 adjusts the read distortion compensation coefficient using the "adjustment coefficient", generates a PD signal Out (t) obtained by multiplying the adjusted distortion compensation coefficient by the transmission baseband signal, and outputs the generated PD signal Out (t) to the DAC 21. In addition, the distortion compensation device 12 corrects (updates) the above-described "adjustment coefficient", based on the "feedback signal" from the communication device 50.

The DAC 21 converts the input signal (known signal or PD signal) from the digital signal into an analog signal, and outputs the converted signal to the up-converter 22.

The up-converter 22 up-converts the analog signal that has been received from the DAC 21, and outputs the up-converted signal to the PA 23.

The PA 23 amplifies the power of the up-converted signal, and transmits the signal having the amplified power through the circulator 15 and an antenna.

A wireless signal that has been received through the antenna and the circulator 15 is input to the down-converter 25. In addition, the down-converter 25 down-converts the input wireless signal, and outputs the down-converted signal to the ADC 26.

The ADC 26 converts the down-converted signal from the analog signal to a digital signal, and outputs the converted digital signal to the reception processing unit 17.

The reception processing unit 17 executes certain reception processing (demodulation, decoding, and the like) for the digital signal that has been received from the ADC 26, and outputs a "feedback signal" included in the obtained received data, to the distortion compensation device 12. Such a "feedback signal" is transmitted from the communication device 50 as described above.

[Configuration Example of Distortion Compensation Device]

Figure 3:
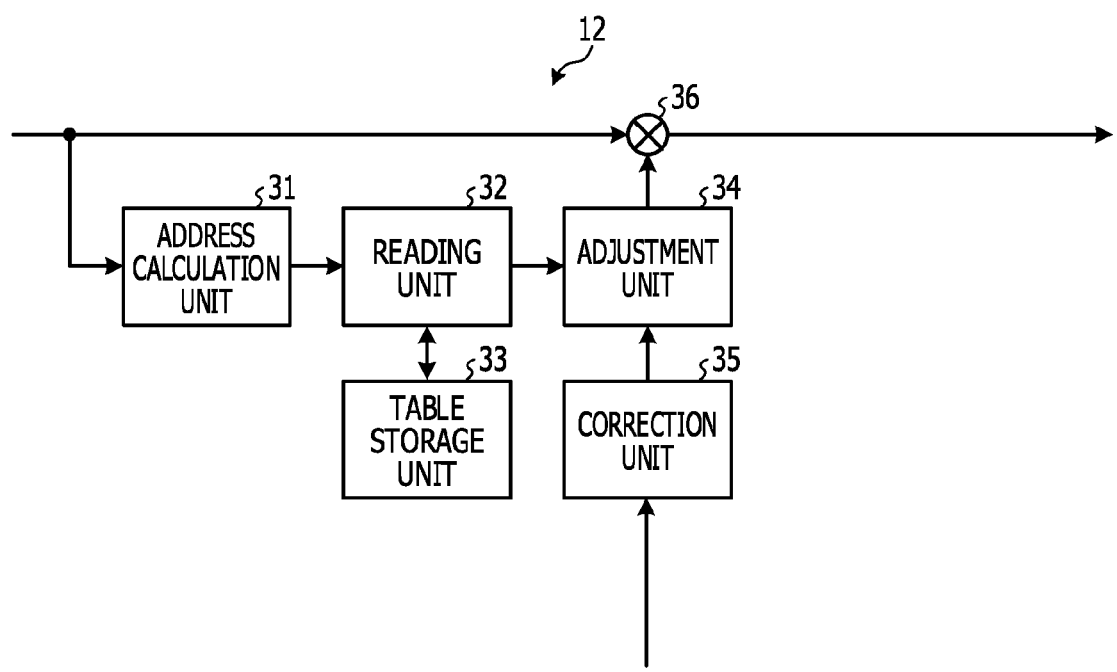
FIG. 3 is a block diagram illustrating an example of a distortion compensation device according to the first embodiment.

FIG. 3 is a block diagram illustrating an example of the distortion compensation device according to the first embodiment. In FIG. 3, the distortion compensation device 12 includes an address calculation unit 31, a reading unit 32, a table storage unit 33, an adjustment unit 34, a correction unit 35, and a multiplication unit 36.

The address calculation unit 31 calculates an address Adr (t) in accordance with a power value of the transmission baseband signal In (t), and outputs the calculated address Adr (t) to the reading unit 32. That is, the address calculation unit 31 calculates an amplitude (that is, a modular value) of the transmission baseband signal In (t) that is a complex signal, as the address Adr (t).

The reading unit 32 reads a distortion compensation coefficient corresponding to the address Adr (t) that has been calculated in the address calculation unit 31, from the "compensation coefficient table" stored in the table storage unit 33.

The table storage unit 33 has a "compensation coefficient table" that stores the plurality of distortion compensation coefficients that respectively corresponds to the plurality of address values.

Figure 4:
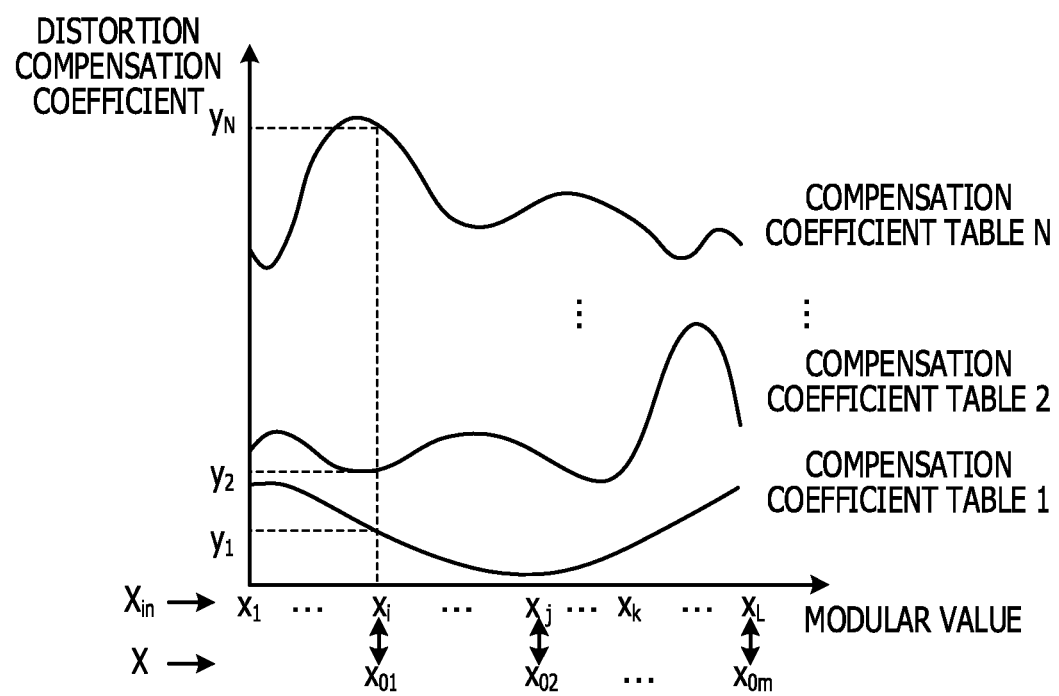
FIG. 4 is a diagram illustrating a compensation coefficient table.

For example, the table storage unit 33 stores N number of compensation coefficient tables that are orthogonal to each other. That is, the inner product of distortion compensation coefficient vectors of any two of the compensation coefficient tables becomes zero. FIG. 4 is a diagram illustrating a compensation coefficient table. In FIG. 4, the horizontal axis indicates an address value, and the vertical axis indicates a distortion compensation coefficient. For example, when an address value that has been calculated in the address calculation unit 31 is set as "$x_i$", the reading unit 32 reads distortion compensation coefficients $y_1, y_2, \ldots$ and, $y_N$ (may be referred to as "distortion compensation coefficient set") corresponding to the address value in each compensation coefficient table. In FIG. 4, "$X_{in}$" includes amplitude values $x_1$ to $x_L$ that are typical of the transmission baseband signal In (t). In addition, "X" is an essential point vector, and the elements $x_{01}$ to $x_{0m}$ are selected from "$X_{in}$".

The adjustment unit 34 adjusts the distortion compensation coefficient that has been read in the reading unit 32 using an "adjustment coefficient". The adjusted distortion compensation coefficient is output to the multiplication unit 36.

Figure 5:
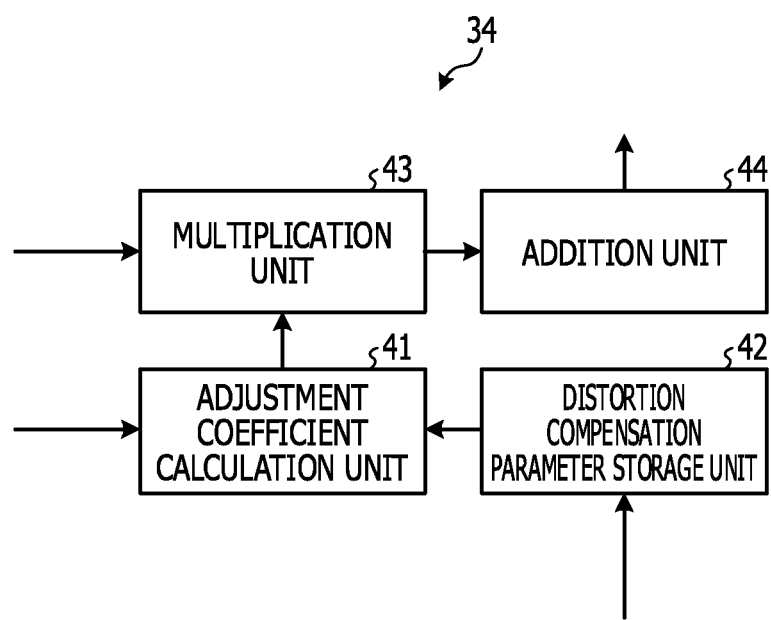
FIG. 5 is a block diagram illustrating an example of an adjustment unit according to the first embodiment.
Figure 6:
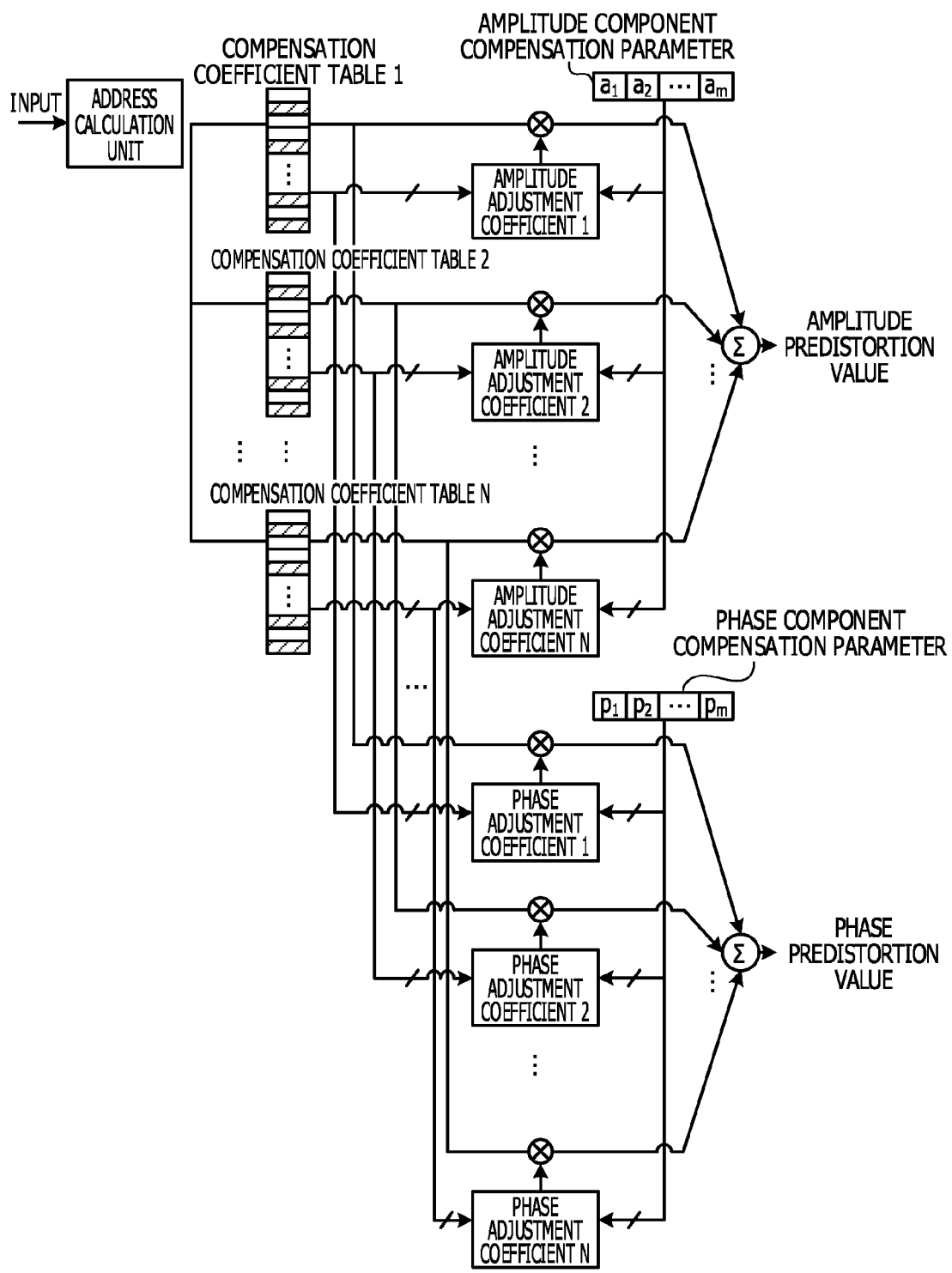
FIG. 6 is a diagram illustrating processing of the adjustment unit according to the first embodiment.

FIG. 5 is a block diagram illustrating an example of the adjustment unit according to the first embodiment. FIG. 6 is a diagram illustrating processing of the adjustment unit according to the first embodiment. In FIG. 5, the adjustment unit 34 includes an adjustment coefficient calculation unit 41, a distortion compensation parameter storage unit 42, a multiplication unit 43, and an addition unit 44.

The adjustment coefficient calculation unit 41 receives a "basic point vector" from each of the compensation coefficient tables. The hatched portion in FIG. 6 indicates an element of the basic point vector. In addition, the adjustment coefficient calculation unit 41 obtains a "distortion compensation parameter" from the distortion compensation parameter storage unit 42. Here, the "distortion compensation parameter" includes an "amplitude component compensation parameter" and a "phase component compensation parameter".

An "amplitude component compensation parameter $V_{am}$" and a "phase component compensation parameter $V_{pm}$" are respectively represented, for example, by the following formulas (1) and (2). The superscript T in the formula indicates a transpose operation.

$$V_{am} = [a_1, a_2, \ldots, a_m]^T \quad (1)$$

$$V_{pm} = [p_1, p_2, \ldots, p_m]^T \quad (2)$$

In addition, the adjustment coefficient calculation unit 41 calculates the "adjustment coefficient" by calculating the inner product between the "distortion compensation parameter" and each of the "basic point vectors". That is, the "adjustment coefficient" is a scalar value. For example, as illustrated in FIG. 6, the adjustment coefficient calculation unit 41 obtains an amplitude adjustment coefficient 1 by calculating the inner product between the "basic point vector" that has been received from a compensation coefficient table 1 and the "amplitude component compensation parameter". In addition, the adjustment coefficient calculation unit 41 obtains a phase adjustment coefficient 1 by calculating the inner product between the "basic point vector" that has been received from the compensation coefficient table 1 and the "phase component compensation parameter". Amplitude adjustment coefficients 2 to N and phase adjustment coefficients 2 to N are calculated similarly.

The "adjustment coefficient" that has been calculated in the adjustment coefficient calculation unit 41 is output to the multiplication unit 43.

The distortion compensation parameter storage unit 42 stores the above-described "distortion compensation parameter". The stored "distortion compensation parameter" is corrected (updated) by the correction unit 35 described later.

The multiplication unit 43 multiplies the distortion compensation coefficient that has been read from each compensation coefficient table in the reading unit 32, by the "adjustment coefficient" corresponding to the compensation coefficient table that is the read source of the distortion compensation coefficient, and outputs the multiplication result to the addition unit 44.

The addition unit 44 calculates the total sum of the multiplication results that have been obtained in the multiplication unit 43 for the amplitude adjustment coefficients. The total sum that has been obtained by such calculation may be referred to as an "amplitude predistortion value". The "amplitude predistortion value" corresponds to an amplitude component of the adjusted distortion compensation coefficient. In addition, the addition unit 44 calculates the total sum of the multiplication results that have been obtained in the multiplication unit 43 for the phase adjustment coefficients. The total sum that has been obtained by such calculation may be referred to as a "phase predistortion value". The "phase predistortion value" corresponds to a phase component of the adjusted distortion compensation coefficient.

The multiplication unit 36 multiplies the adjusted distortion compensation coefficient by the above-described transmission baseband signal, and outputs the obtained "PD signal" to the DAC 21.

The correction unit 35 corrects (updates) the "adjustment coefficient" used in the adjustment unit 34, based on the "feedback signal" from the communication device 50. For example, the correction unit 35 corrects (updates) the adjustment coefficient by correcting (updating) the distortion compensation parameter stored in the distortion compensation parameter storage unit 42. As the correction method, for example, a gradient descent method may be used. When the gradient descent method is used, update of the "amplitude component compensation parameter" and update of the "phase component compensation parameter" may be respectively represented by the following formulas (3) and (4).

$$V_{am}(n+1) = V_{am}(n) - \mu_a \cdot (\partial J(n)/\partial V_{am}) \quad (3)$$

$$V_{pm}(n+1) = V_{pm}(n) - \mu_p \cdot (\partial J(n)/\partial V_{pm}) \quad (4)$$

Here, "$J(n)$" is the value of a "feedback signal" of the n-th repetition (that is, a gap amount). In addition, "$\mu_a$" and "$\mu_p$" are step lengths to be updated.

Here, when the value of a "feedback signal" from the communication device 50 (that is, a gap amount) is less than a "threshold value", the correction unit 35 does not execute the above-described correction (update), and when the value of the "feedback signal" from the communication device 50 is the "threshold value" or more, the correction unit 35 may execute the above-described correction (update).

[Configuration Example of Second Communication Device]

Figure 7:
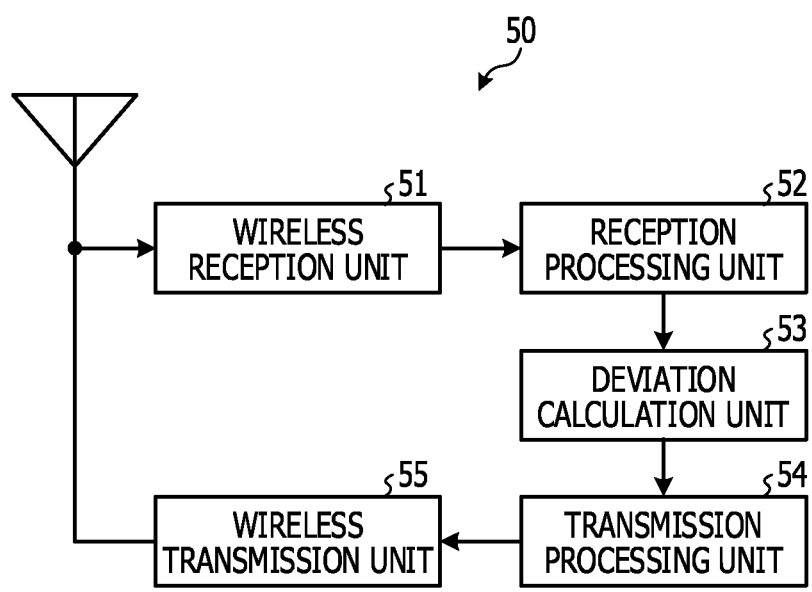
FIG. 7 is a block diagram illustrating an example of a second communication device according to the first embodiment.

FIG. 7 is a block diagram illustrating an example of the second communication device according to the first embodiment. In FIG. 7, the communication device 50 includes a wireless reception unit 51, a reception processing unit 52, a gap calculation unit 53, a transmission processing unit 54, and a wireless transmission unit 55.

The wireless reception unit 51 executes certain wireless reception processing (down-conversion, analog-to-digital conversion, and the like) for a signal that has been received through an antenna, and outputs the signal to the reception processing unit 52.

The reception processing unit 52 executes certain reception processing (demodulation and the like) for the signal that has been received from the wireless reception unit 51, and outputs the signal to the gap calculation unit 53. Specifically, the reception processing unit 52 outputs the signal corresponding to the "known signal" that has been transmitted from the communication device 10, to the gap calculation unit 53.

The gap calculation unit 53 calculates the "gap" between the "reception signal point" of the signal corresponding to the "known signal", which has been received from the reception processing unit 52, and the "expected signal point" coming from the signal. Here, as described above, the "known signals" correspond to "certain signal points" using the symbol s ("s" is a natural number) on a constellation diagram in accordance with the modulation scheme of the transmission baseband signal. That is, the "known signals" correspond to symbols, for example, "11" symbols on the constellation diagram in accordance with quadrature phase shift keying (QPSK). In this case, the "reception signal points" are "11".

Figure 8:
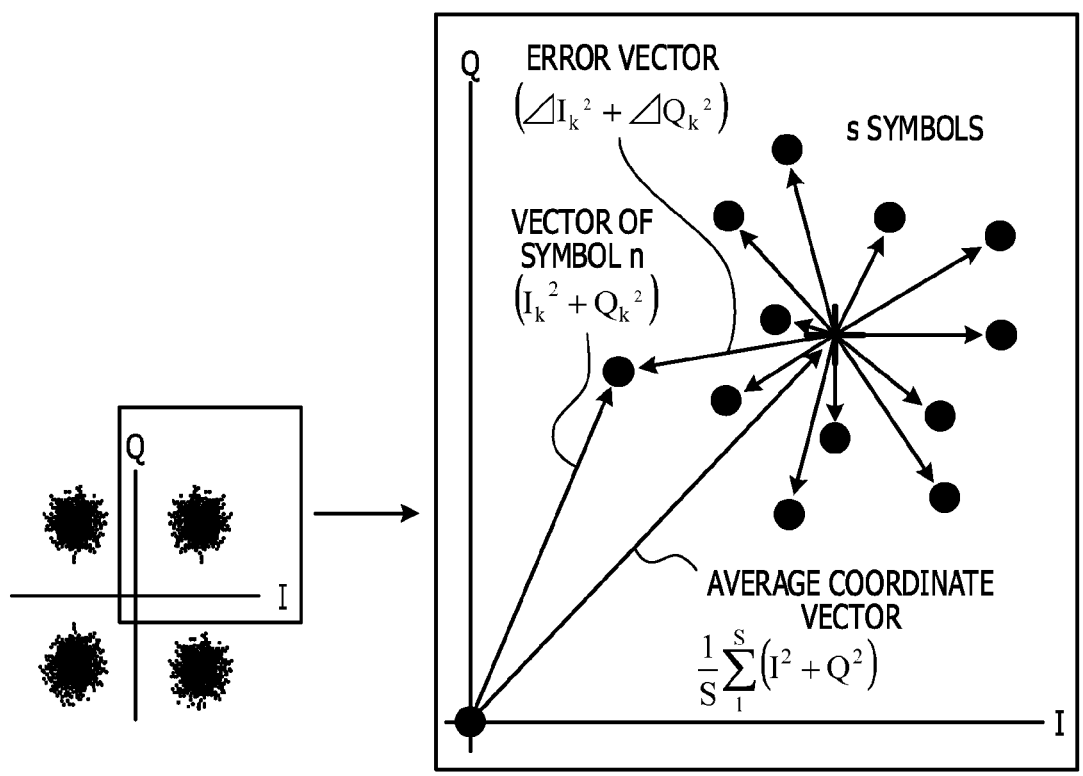
FIG. 8 is a diagram illustrating calculation of a gap in the first embodiment.

For example, the gap calculation unit 53 may calculate, as the "gap", an "error vector" in which the "expected signal point" is used as a starting point, and the "reception signal point" is used as an ending point. That is, the "error vector" is represented by an angle made by a reference line and a line segment extending from the "expected signal point" to the "reception signal point", and the length of the line segment. Alternatively, the gap calculation unit 53 may calculate, as the "gap", a "modulation error ratio (MER)" based on the "error vector" in which the "expected signal point" is used as the starting point, and the "reception signal point" is used as the ending point. FIG. 8 is a diagram illustrating the calculation of a gap in the first embodiment. In the left diagram of FIG. 8, a constellation diagram of QPSK is illustrated. The right diagram in FIG. 8 is a diagram in which the first quadrant of the left diagram of in FIG. 8 has been enlarged. In the constellation diagram illustrated in the right diagram of FIG. 8, the position indicated by a cross indicates the position of the "expected signal point". As descried above, the gap calculation unit 53 may calculate, as the "gap", an "error vector" between the k-th "reception signal point" illustrated in the right diagram of FIG. 8 and the "expected signal point". Alternatively, the gap calculation unit 53 may calculate, as the "gap", a "MER" based on the "error vector group" between the "expected signal point" and s "reception signal points" illustrated in the right diagram of FIG. 8, and the following formula (5).

[Mathematical Formula 5]

$$MER = 10 \cdot \log_{10} \frac{\frac{1}{s}\sum_{1}^{s}(I^2 + Q^2)}{\frac{1}{s}\sum_{1}^{s}(\Delta I^2 + \Delta Q^2)} \quad (5)$$

The transmission processing unit 54 executes certain transmission processing (coding, modulation, and the like) for the feedback signal including information on the "gap" that has been calculated in the gap calculation unit 53, and outputs the signal to the wireless transmission unit 55.

The wireless transmission unit 55 executes certain wireless transmission processing (digital-to-analog conversion, up-conversion, and the like) for the feedback signal that has been received from the transmission processing unit 54, and transmits the feedback signal through the antenna.

[Operation Example of Wireless Communication System]

A processing operation example of the wireless communication system 1 including the above-described configuration is described below.

As described above, the communication device 10 amplifies the "known signal (that is, a calibration bit)" in the PA 23 at "certain timing", and transmits the known signal to the communication device 50.

When the communication device 50 receives the known signal that has been transmitted from the communication device 10, the communication device 50 calculates the gap between the reception signal point of the received known signal and the expected signal point coming from the known signal. In addition, the communication device 50 transmits a feedback signal including information on the calculated gap, to the communication device 10.

When the communication device 10 receives the feedback signal from the communication device 50, the communication device 10 corrects (updates) the "adjustment coefficient" used in the adjustment unit 34, based on the feedback signal, in the correction unit 35.

As described above, in the embodiment, in the distortion compensation device 12, the correction unit 35 corrects (updates) the adjustment coefficient used in the adjustment unit 34, based on the feedback signal sent back from the communication device 50 that has received the signal transmitted from the communication device 10. The feedback signal includes information on the gap between the reception signal point of the known signal that has been transmitted from the communication device 10, and the expected signal point coming from the known signal.

Due to such a configuration of the distortion compensation device 12, the "adjustment coefficient" may be adjusted based on the "feedback signal" from the reception side device (that is, the communication device 50), obtained from the signal that has been actually transmitted using the "transmission band", so that the adjustment coefficient may be adjusted by reflecting the communication quality in the reception side device. In addition, due to such a configuration of the distortion compensation device 12, the "adjustment coefficient" may be adjusted based on the "feedback signal" from the reception side device (that is, the communication device 50), obtained from the signal that has been actually transmitted using the "transmission band", so that the accuracy of the "distortion compensation processing in the transmission band" may be improved. In addition, it may be avoided that a feedback path is provided in the communication device 10, so that an increased in the circuit scale of the communication device 10 may be avoided.

In addition, the known signal (that is, a calibration bit) has an amplitude corresponding to the non-linear domain of the PA 23. Therefore, a non-linear distortion component may be appropriately superimposed over the known signal output from the PA 23.

In addition, in the communication device 50, the gap calculation unit 53 calculates the "gap" between the "reception signal point" of the signal corresponding to the received "known signal", and the "expected signal point" coming from the signal. The gap calculation unit 53 may calculate, as the "gap", an "error vector" in which the "expected signal point" is used as a starting point, and the "reception signal point" is used as an ending point. Alternatively, the gap calculation unit 53 may calculate, as the "gap", a "MER" based on the "error vector" in which the "expected signal point" is used as the starting point, and the "reception signal point" is used the ending point.

Second Embodiment

In the first embodiment, information on the gap between the reception signal point of a known signal transmitted from the communication device on the transmission side including the distortion compensation device, and the expected signal point is used as a feedback signal. On the contrary, in a second embodiment, information on the gap between the reception signal point of a regular data signal (that is, the transmission baseband signal in the first embodiment) transmitted from a transmission side device including a distortion compensation device and the expected signal point is used as a feedback signal.

[Configuration Example of Wireless Communication System]

Figure 9:
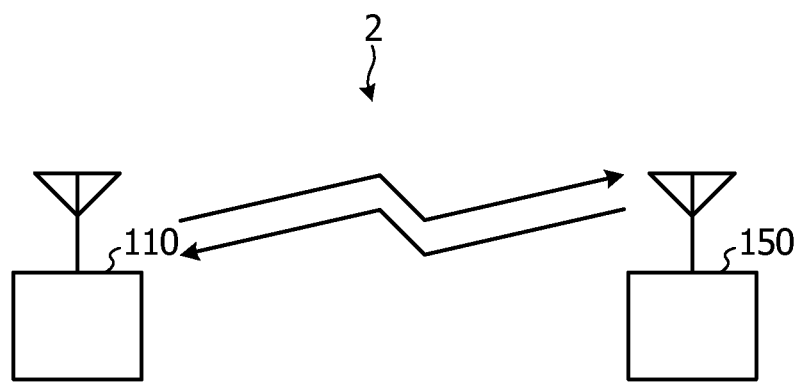
FIG. 9 is a diagram illustrating an example of a wireless communication system according to a second embodiment.

FIG. 9 is diagram illustrating an example of a wireless communication system according to the second embodiment. In FIG. 9, a wireless communication system 2 includes a communication device 110 that amplifies the power of a transmission signal through an amplifier, and transmits the signal using the "transmission band", and a communication device 150 that receives the signal that has been transmitted from the communication device 110. For example, one of the communication device 110 and the communication device 150 may be a wireless base station, and the other communication device may be a wireless terminal device, and both of the communication devices may be wireless terminal devices. Hereinafter, the communication device 110 may be referred to as the "first communication device", and the communication device 150 may be referred to as the "second communication device".

The communication device 110 does not perform transmission of the above-described "known signal", differently from the communication device 10 according to the first embodiment.

Similar to the communication device 50 according to the first embodiment, the communication device 150 receives the signal that has been transmitted from the communication device 110 using a "transmission band", and calculates the "gap" between the "reception signal point" of the received signal and the "expected signal point" coming from the received signal. In addition, the communication device 150 transmits information on the calculated "gap", to the communication device 110, as a "feedback signal".

However, in the second embodiment, the received signal used for the calculation of a gap is not a known signal, so that a symbol (signal point) on a constellation diagram, which is the closest to the "reception signal point" of the received signal, is used as the "expected signal point". In addition, the communication device 150 uses each symbol on the constellation diagram as the expected signal point, and calculates the "gap" for each of the expected signal points. Similar to the first embodiment, the "gap" that is a calculation target may be an error vector, and may be an MER.

The communication device 150 causes information on the "gaps" that have been calculated for the expected signal points to be included in the feedback signal, and transmits the feedback signal to the communication device 110.

The communication device 110 performs weighted average on the plurality "gaps" included in the feedback signal, using a weighting factor. The weighting factor for the expected signal point having a larger distance (namely, being farther) from the origin on the constellation diagram becomes greater.

In addition, similar to the first embodiment, the communication device 110 controls execution of correction (update) of the "adjustment coefficient" based on a magnitude relation between the weighted average value and "threshold value".

Here, the weighted average value is calculated in the communication device 110, but the embodiment is not limited to such an example, and a weighted average value may be calculated in the communication device 150, and the obtained weighted average value may be used as a feedback signal.

As described above, an effect similar to that of the first embodiment may be obtained even using a regular data signal.

[Configuration Example of First Communication Device]

Figure 10:
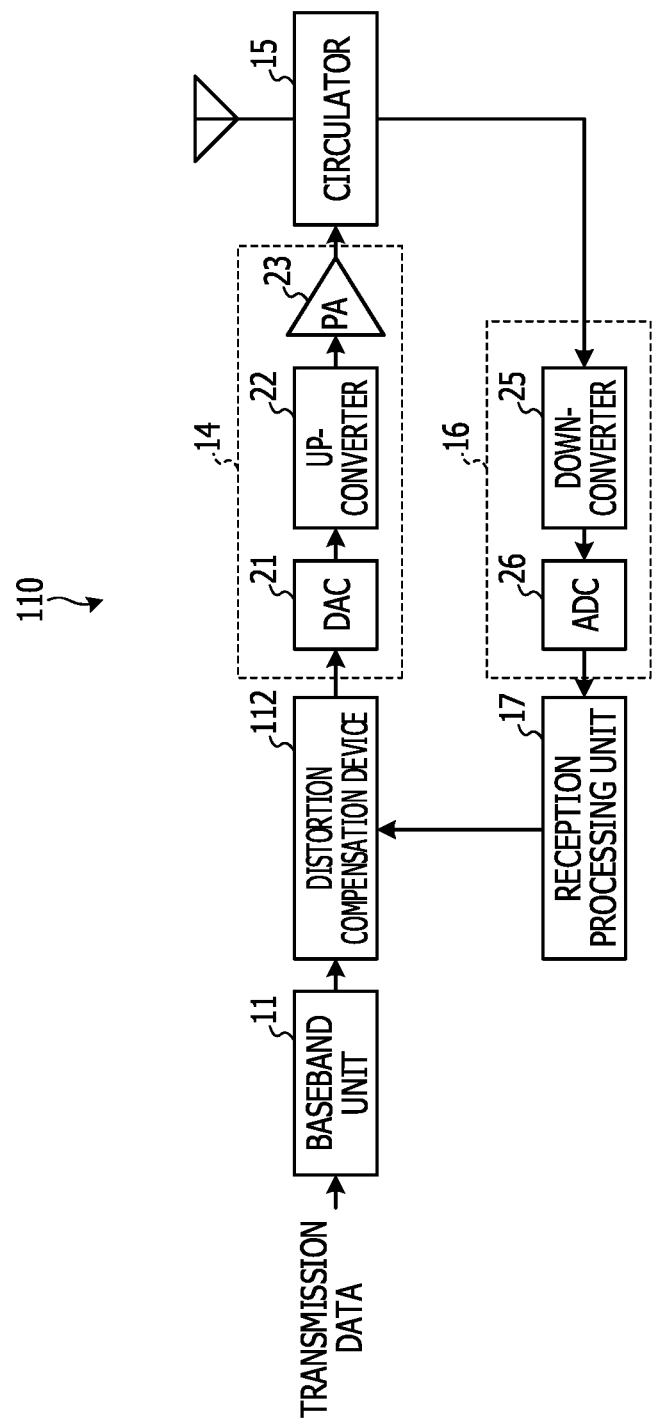
FIG. 10 is a block diagram illustrating an example of a first communication device according to the second embodiment.

FIG. 10 is a block diagram illustrating an example of the first communication device according to the second embodiment. In FIG. 10, the communication device 110 includes a distortion compensation device 112.

Figure 11:
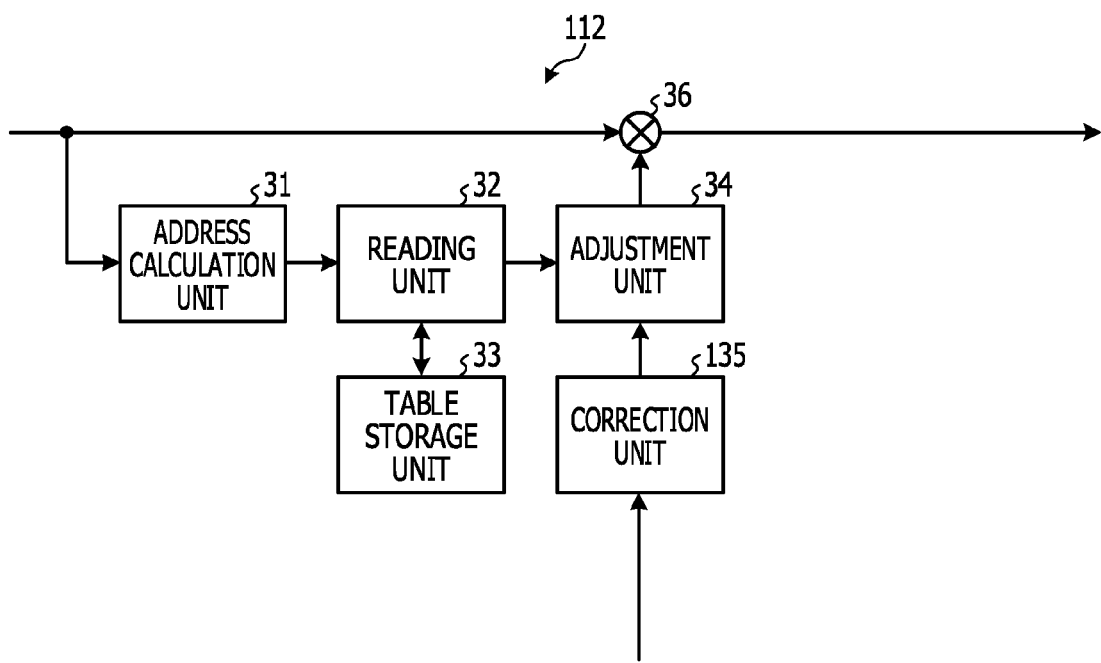
FIG. 11 is a block diagram illustrating an example of a distortion compensation device according to the second embodiment.

FIG. 11 is a block diagram of an example of the distortion compensation device according to the second embodiment. In FIG. 11, the distortion compensation device 112 includes a correction unit 135.

The correction unit 135 corrects (updates) the "adjustment coefficient" used in the adjustment unit 34, based on the "feedback signal" from the communication device 150. As described above, the feedback signal includes information on the "gaps" that have been calculated for the expected signal points. For example, the correction unit 135 performs weighted average on the plurality of "gaps" included in the feedback signal, using a weighting factor, and corrects (updates) the adjustment coefficient based on the obtained weighted average value, using, for example, the above-described gradient descent method.

[Configuration Example of Second Communication Device]

Figure 12:
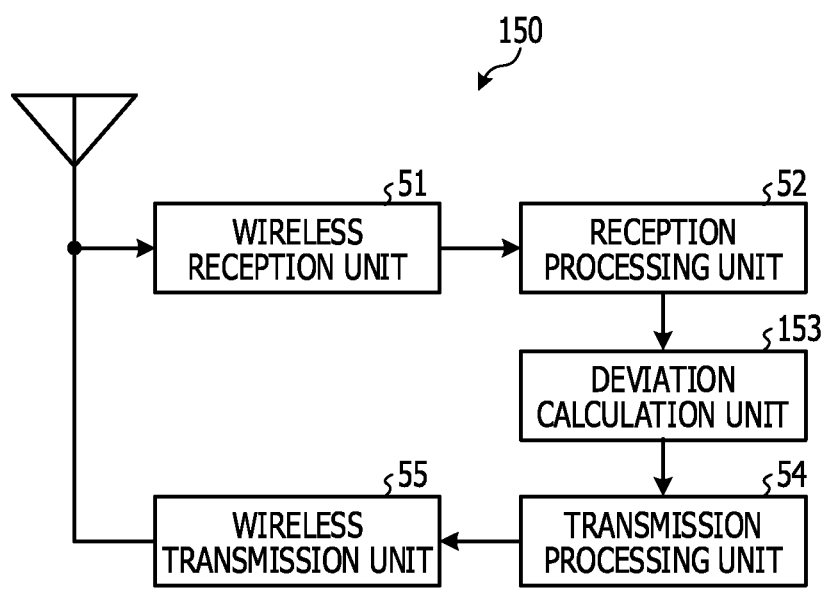
FIG. 12 is a block diagram illustrating an example of a second communication device according to the second embodiment.

FIG. 12 is a block diagram illustrating an example of the second communication device according to the second embodiment. In FIG. 12, the communication device 150 includes a gap calculation unit 153.

The gap calculation unit 153 uses each symbol on the constellation diagram as the expected signal point and calculates the "gap" for each of the expected signal points. Similar to the first embodiment, the "gap" that is a calculation target may be an error vector, and may be an MER.

As described above, in the embodiment, in the communication device 150, the gap calculation unit 153 uses each of the symbols on the constellation diagram as the expected signal point, and calculates the "gap" for each of the expected signal points. In addition, the transmission processing unit 54 and the wireless transmission unit 55 feed back information on the gaps that have been calculated in the gap calculation unit 153, to the communication device 110.

Due to such a configuration of the communication device 150, it may be avoided that an output function of a "known signal" is provided in the communication device 110, so that the device scale of the communication device 110 may be downsized as compared with the communication device 10 according to the first embodiment.

As described above, in the communication device 150, a weighted average value is calculated, and information on the calculated weighted average value may be used as a feedback signal. Therefore, a data amount of the feedback signal may be reduced.

Third Embodiment

In the first and second embodiments, the gap between the reception signal point and the expected signal point is used as the feedback signal in the communication device on the reception side. On the contrary, in a third embodiment, an "error rate" of a received signal in a communication device on the reception side is used as a feedback signal.

[Configuration Example of Wireless Communication System]

Figure 13:
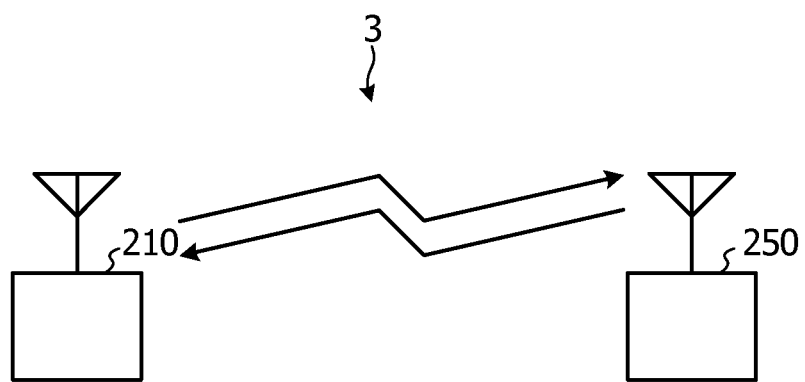
FIG. 13 is a diagram illustrating an example of a wireless communication system according to a third embodiment.

FIG. 13 is diagram illustrating an example of a wireless communication system according to the third embodiment. In FIG. 13, a wireless communication system 3 includes a communication device 210 that amplifies the power of a transmission signal through an amplifier, and transmits the signal using a "transmission band", and a communication device 250 that receives the signal that has been transmitted from the communication device 210. For example, one of the communication device 210 and the communication device 250 may be a wireless base station, and the other communication device may be a wireless terminal device, and both of the communication devices may be wireless terminal devices. Hereinafter, the communication device 210 may be referred to as the "first communication device", and the communication device 250 may be referred to as the "second communication device".

Similar to the communication device 50 according to the first embodiment, the communication device 250 receives the signal that has been transmitted from the communication device 210 using a "transmission band". In addition, the communication device 250 calculates an "error rate (for example, a BER)" of the received signal. In addition, the communication device 250 transmits information on the calculated error rate, to the communication device 210, as a "feedback signal".

Similar to the first embodiment, the communication device 210 controls execution of correction (update) of the "adjustment coefficient", based on a magnitude relation between the "error rate" included in the feedback signal and a "threshold value".

[Configuration Example of First Communication Device]

Figure 14:
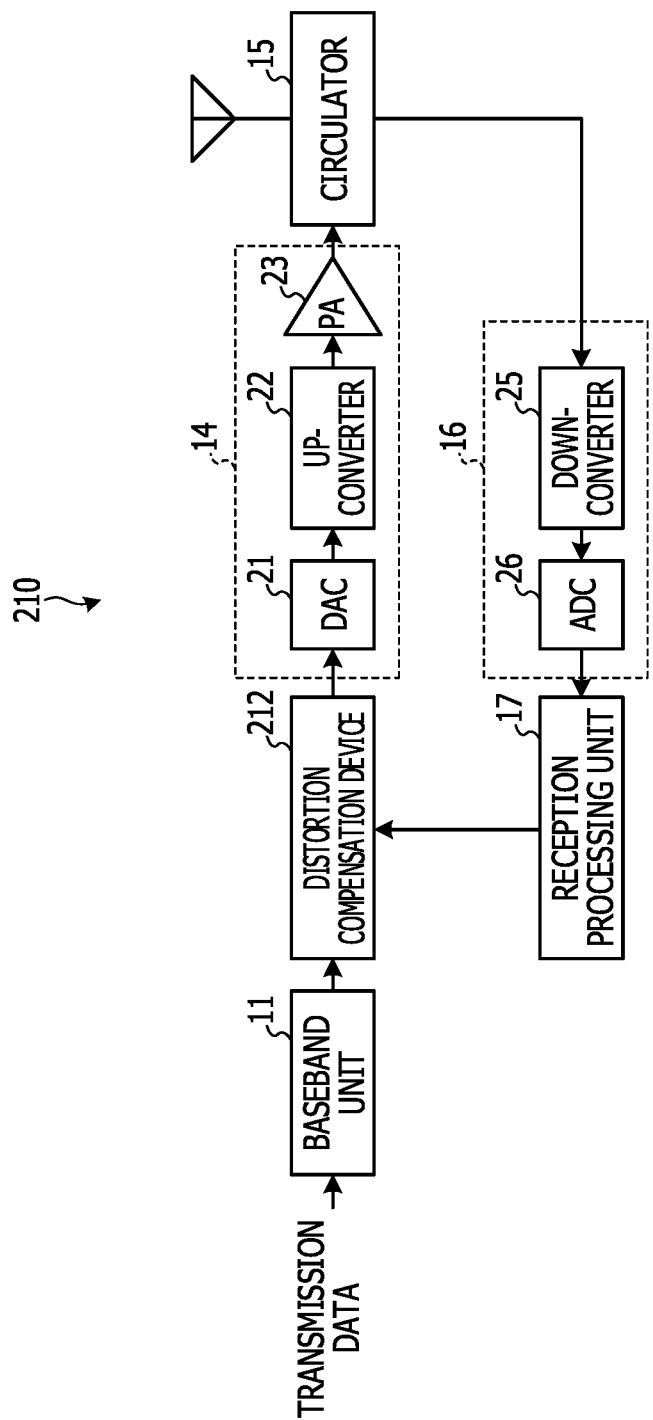
FIG. 14 is a block diagram illustrating an example of a first communication device according to the third embodiment.

FIG. 14 is a block diagram illustrating the first communication device according to the third embodiment. In FIG. 14, the communication device 210 includes a distortion compensation device 212.

Figure 15:
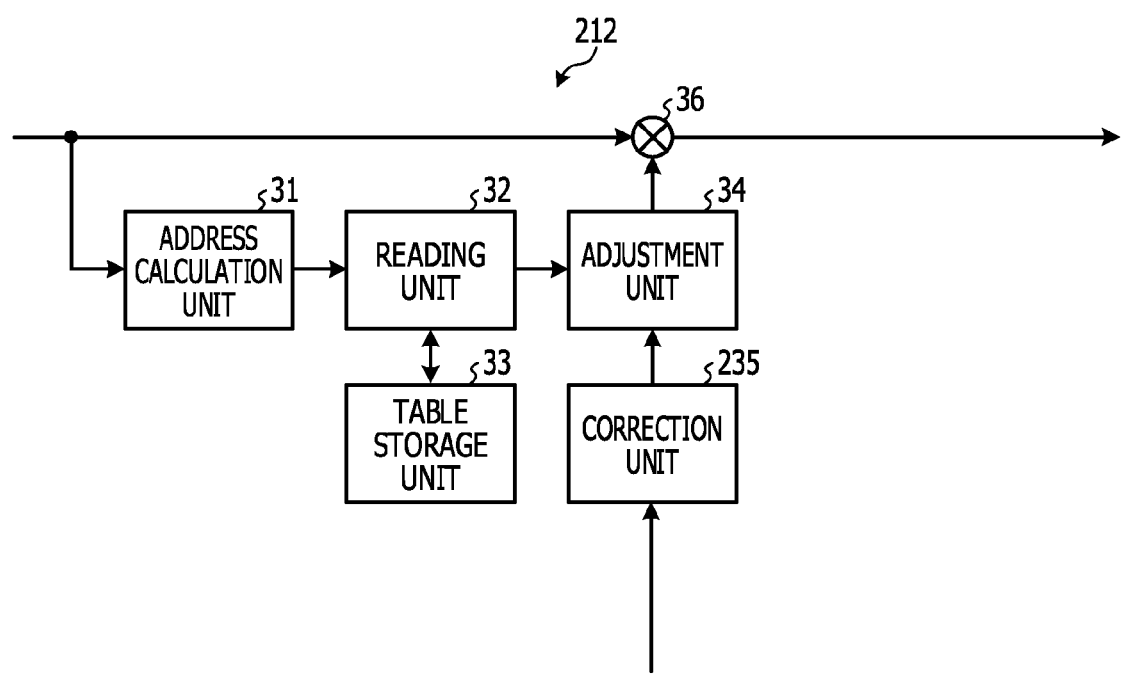
FIG. 15 is a block diagram illustrating an example of a distortion compensation device according to the third embodiment.

FIG. 15 is a block diagram illustrating the distortion compensation device according to the third embodiment. In FIG. 15, the distortion compensation device 212 includes a correction unit 235.

The correction unit 235 corrects (updates) the "adjustment coefficient" used in the adjustment unit 34, based on the "feedback signal" from the communication device 250. The feedback signal includes the information on the "error rate" as described above. For example, the correction unit 235 corrects (updates) the adjustment coefficient, based on the "error rate", using the above-described gradient descent method.

[Configuration Example of Second Communication Device]

Figure 16:
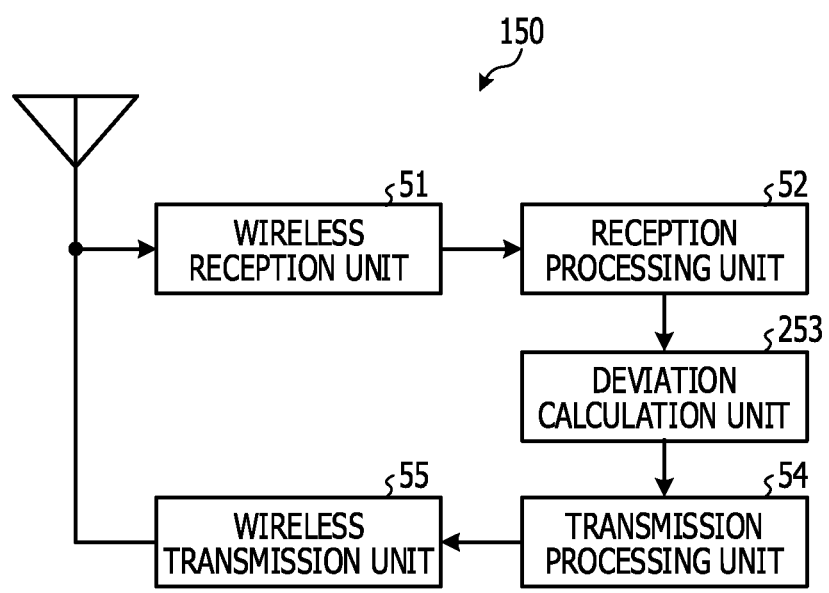
FIG. 16 is a block diagram illustrating an example of a second communication device according to the third embodiment.

FIG. 16 is a block diagram illustrating an example of the second communication device according to the third embodiment. In FIG. 16, the communication device 250 includes an error rate calculation unit 253. The error rate calculation unit 253 calculates an error rate of the signal that has been transmitted from the communication device 210.

As described above, in the embodiment, in the communication device 250, the error rate calculation unit 253 calculates the error rate of the signal that has been transmitted from the communication device 210. In addition, the transmission processing unit 54 and the wireless transmission unit 55 feed back the information on the error rate that has been calculated in the error rate calculation unit 253, to the communication device 210.

Due to such a configuration of the communication device 250, it may be avoided that an output function of a "known signal" is provided in the communication device 210, so that the device scale of the communication device 210 may be downsized as compared with the communication device 10 according to the first embodiment.

Fourth Embodiment

In a fourth embodiment, an existing "feedback path in a device" is added the configuration of the first communication device on the transmission side according to the first embodiment.

[Configuration Example of First Communication Device]

Figure 17:
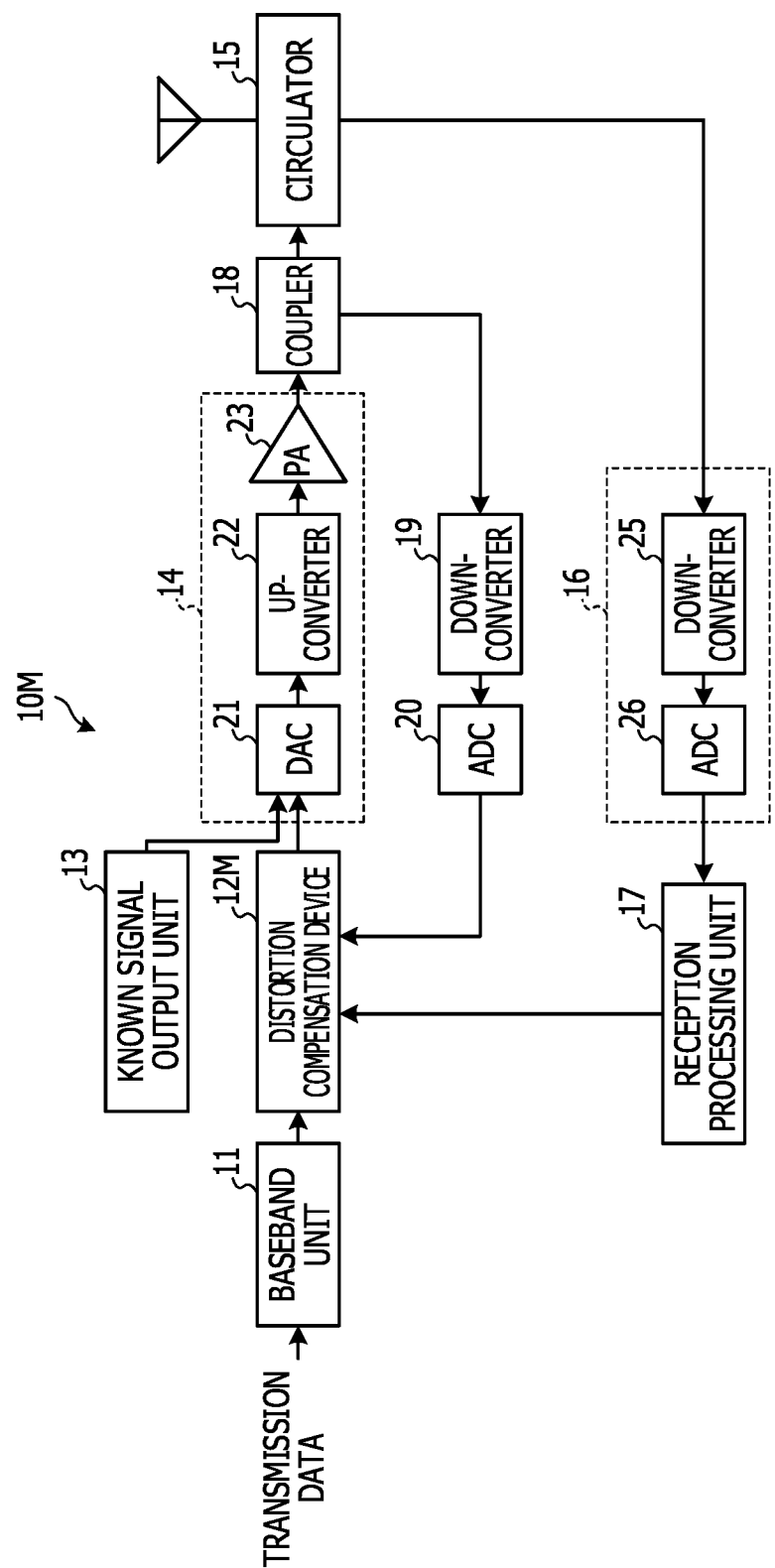
FIG. 17 is a block diagram illustrating an example of a first communication device according to a fourth embodiment.

FIG. 17 is a block diagram illustrating an example of a first communication device according to the fourth embodiment. In FIG. 17, a communication device 10M includes a distortion compensation device 12M. In addition, the communication device 10M includes a coupler 18, a down-converter 19, and an ADC 20. That is, the communication device 10M includes a feedback path in the device.

The coupler 18 outputs a part of an output signal of the PA 23, to the down-converter 19, that is, the feedback path in the device.

The down-converter 19 down-converts the output signal of the PA 23, which has been received through the coupler 18, and outputs the down-converted signal to the ADC 20.

The ADC 20 converts the down-converted signal from the analog signal to a digital signal, and outputs the converted digital signal (hereinafter may be referred to as a "feedback signal in the device") to the distortion compensation device 12M.

Figure 18:
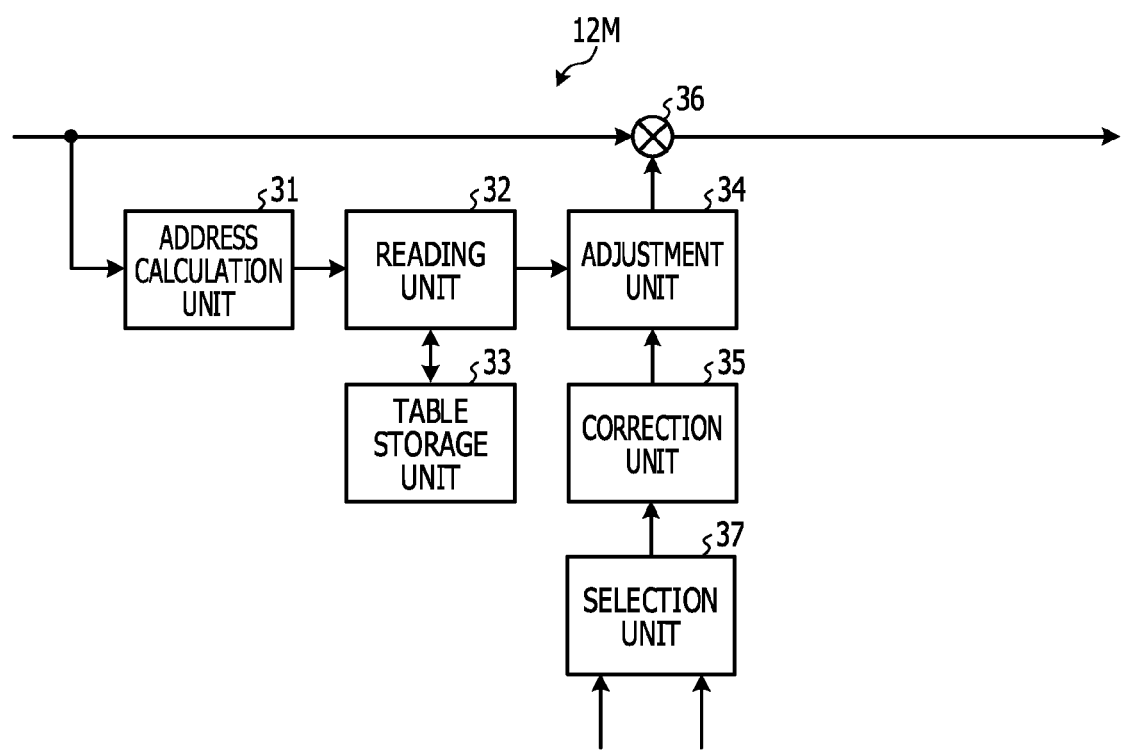
FIG. 18 is a block diagram illustrating an example of a distortion compensation device according to the fourth embodiment.

FIG. 18 is a block diagram illustrating an example of the distortion compensation device according to the fourth embodiment. In FIG. 18, the distortion compensation device 12M includes a selection unit 37.

The selection unit 37 (or selector 37) selects one of a feedback signal from the communication device 50 (hereinafter may be referred to as a "feedback signal outside the device") and the above-described feedback signal in the device, and outputs the selected signal to the correction unit 35. That is, the selection unit 37 performs switching between the feedback path outside the device and the feedback path in the device.

For example, in a state in which communication between the communication device 10M and the communication device 50 is not established (for example, the state before the communication starts), the selection unit 37 switches the path to the feedback path in the device. In addition, in a state in which the communication between the communication device 10M and the communication device 50 has been established (for example, the state after the communication has started), the selection unit 37 switches the path to the feedback path outside the device.

In addition, when the communication quality level of the communication path from the communication device 50 to the communication device 10M is lower than a certain level in the state in which the selection unit 37 has switched the path to the feedback path outside the device, the selection unit 37 switches the feedback path outside the device to the feedback path in the device. Here, the "case in which the communication quality level of the communication path from the communication device 50 to the communication device 10M is lower than the certain level" is, for example, a case in which the communication between the communication device 50 and the communication device 10M has been disconnected, or a case in which an error rate (for example, a BER) of the transmission signal from the communication device 50 to the communication device 10M is lower than a certain value.

As described above, in the embodiment, the communication device 10M includes the feedback path in the device, in addition to the configuration similar to that of the communication device 10. In addition, in the distortion compensation device 12M, the selection unit 37 outputs, to the correction unit 35, a feedback signal sent back from the communication device 50 that has received a signal transmitted from the communication device 10, or a feedback signal in the device.

Due to such a configuration of the distortion compensation device 12M, even in the state in which the communication between the communication device 10M and the communication device 50 is not established, the adjustment coefficient may be corrected (updated).

Fifth Embodiment

In a fifth embodiment, an existing "feedback path in a device" is added to the configuration of the first communication device on the transmission side according to the second embodiment.

[Configuration Example of First Communication Device]

Figure 19:
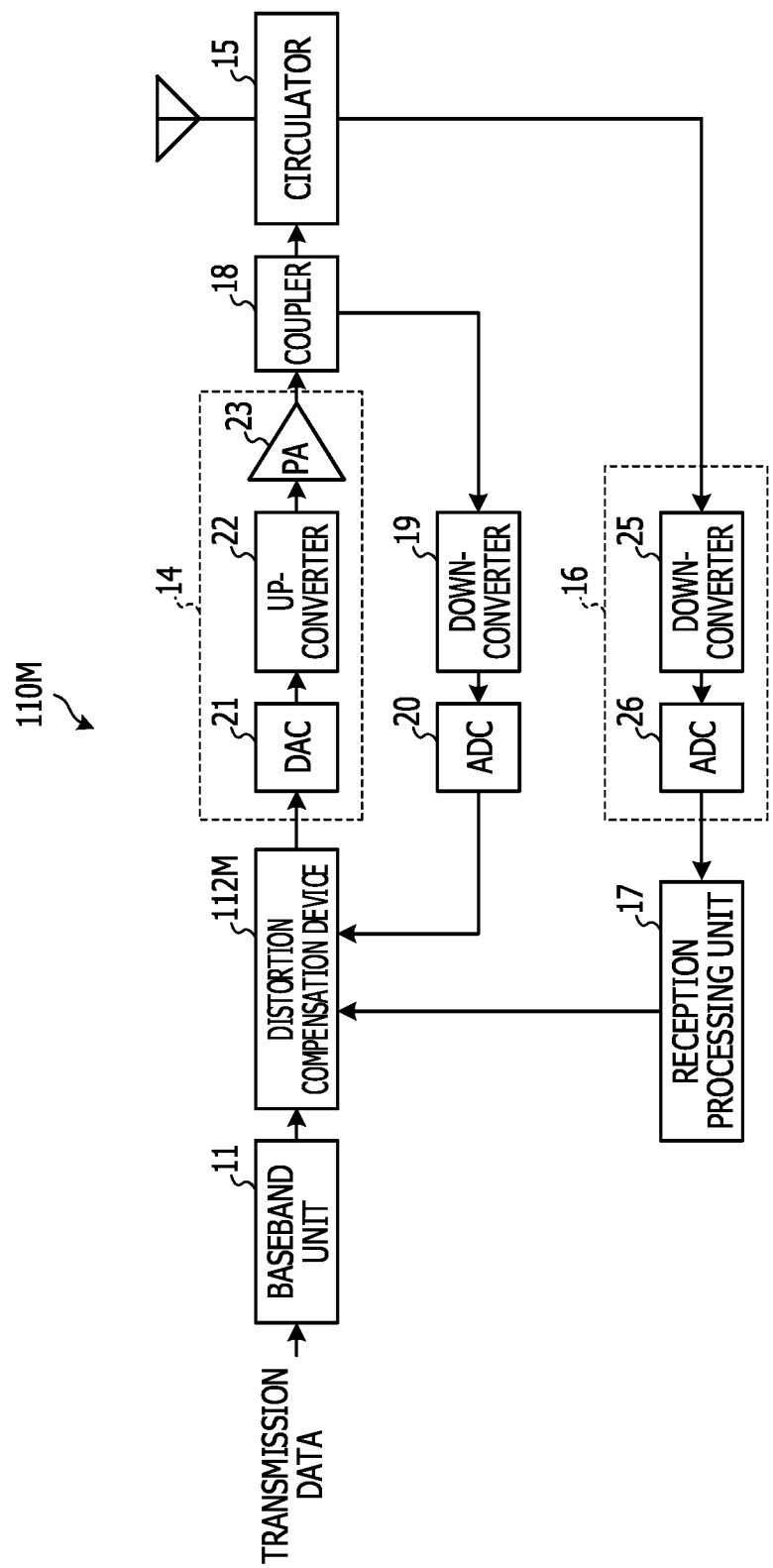
FIG. 19 is a block diagram illustrating an example of a first communication device according to a fifth embodiment.

FIG. 19 is a block diagram illustrating an example of a first communication device according to the fifth embodiment. In FIG. 19, a communication device 110M includes a distortion compensation device 112M. In addition, the communication device 110M includes a coupler 18, a down-converter 19, and an ADC 20. That is, the communication device 110M includes a feedback path in the device.

Figure 20:
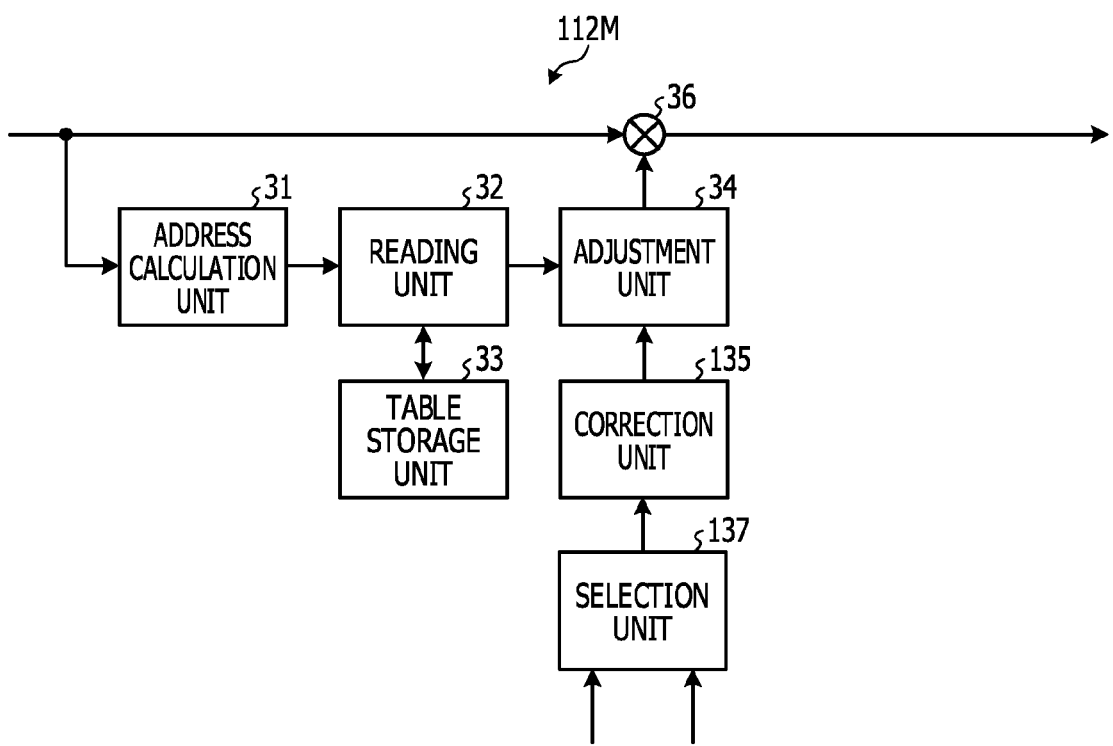
FIG. 20 is a block diagram illustrating an example of a distortion compensation device according to the fifth embodiment.

FIG. 20 is a block diagram illustrating an example of the distortion compensation device according to the fifth embodiment. In FIG. 20, the distortion compensation device 112M includes a selection unit 137.

The selection unit 137 selects one of a feedback signal from the communication device 150 (that is, a "feedback signal outside the device") and a feedback signal in the device, and outputs the selected signal to the correction unit 135. That is, the selection unit 137 performs switching between the feedback path outside the device and the feedback path in the device. The switching processing by the selection unit 137 may be executed similar to that of the selection unit 37 according to the fourth embodiment.

As described above, in the embodiment, the communication device 110M includes the feedback path in the device, in addition to the configuration similar to that of the communication device 110. In addition, in the distortion compensation device 112M, the selection unit 137 outputs, to the correction unit 135, a feedback signal sent back from the communication device 150 that has received a signal transmitted from the communication device 110, or a feedback signal in the device.

Due to such a configuration of the distortion compensation device 112M, even in the state in which the communication between the communication device 110M and the communication device 150 is not established, the adjustment coefficient may be corrected (updated).

Sixth Embodiment

In a sixth embodiment, an existing "feedback path in a device" is added to the configuration of the first communication device on the transmission side according to the third embodiment.

[Configuration Example of First Communication Device]

Figure 21:
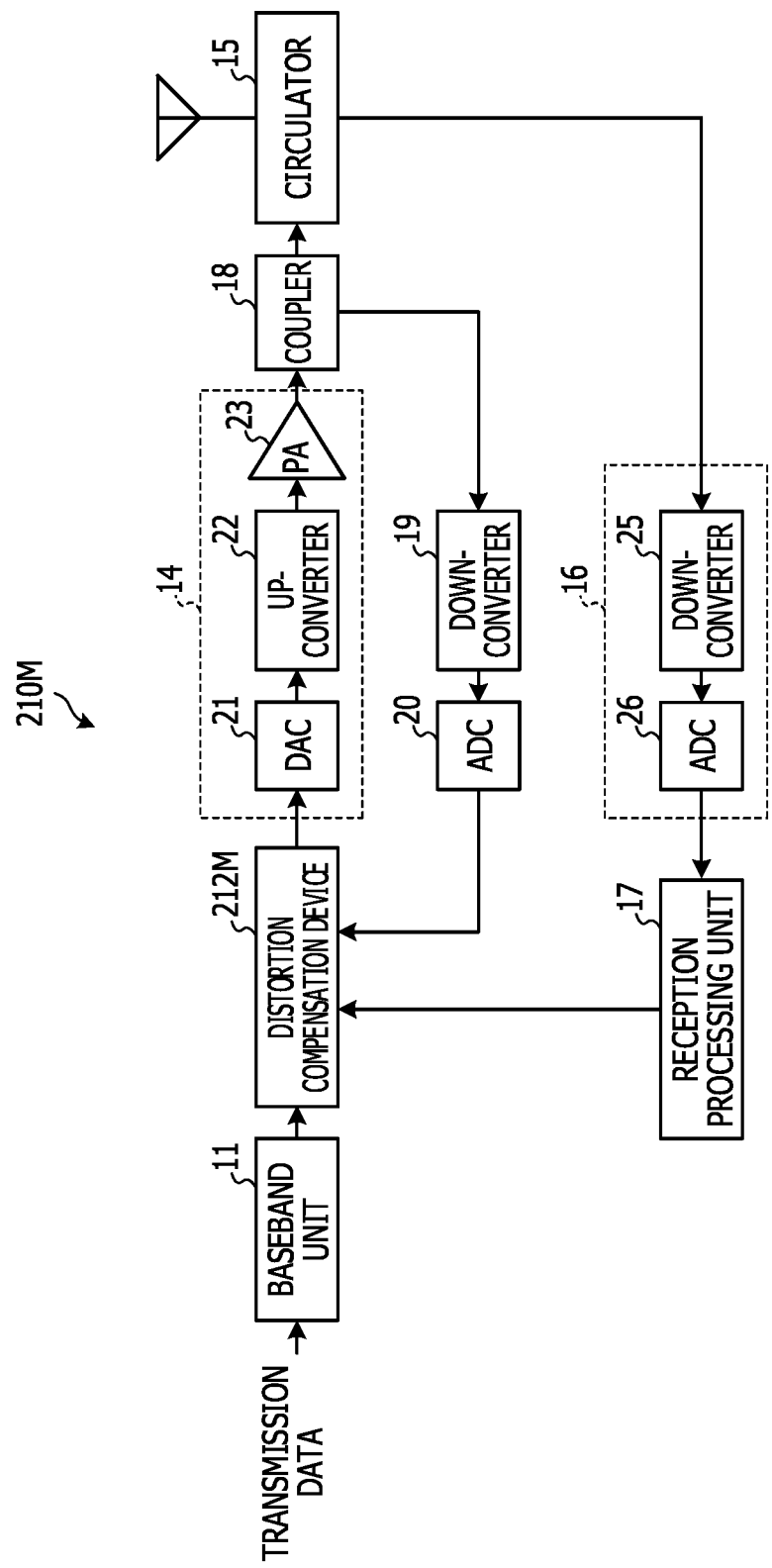
FIG. 21 is a block diagram illustrating an example of a first communication device according to a sixth embodiment.

FIG. 21 is a block diagram illustrating an example of a first communication device according to the sixth embodiment. In FIG. 21, a communication device 210M includes a distortion compensation device 212M. In addition, the communication device 210M includes a coupler 18, a down-converter 19, and an ADC 20. That is, the communication device 210M includes a feedback path in the device.

Figure 22:
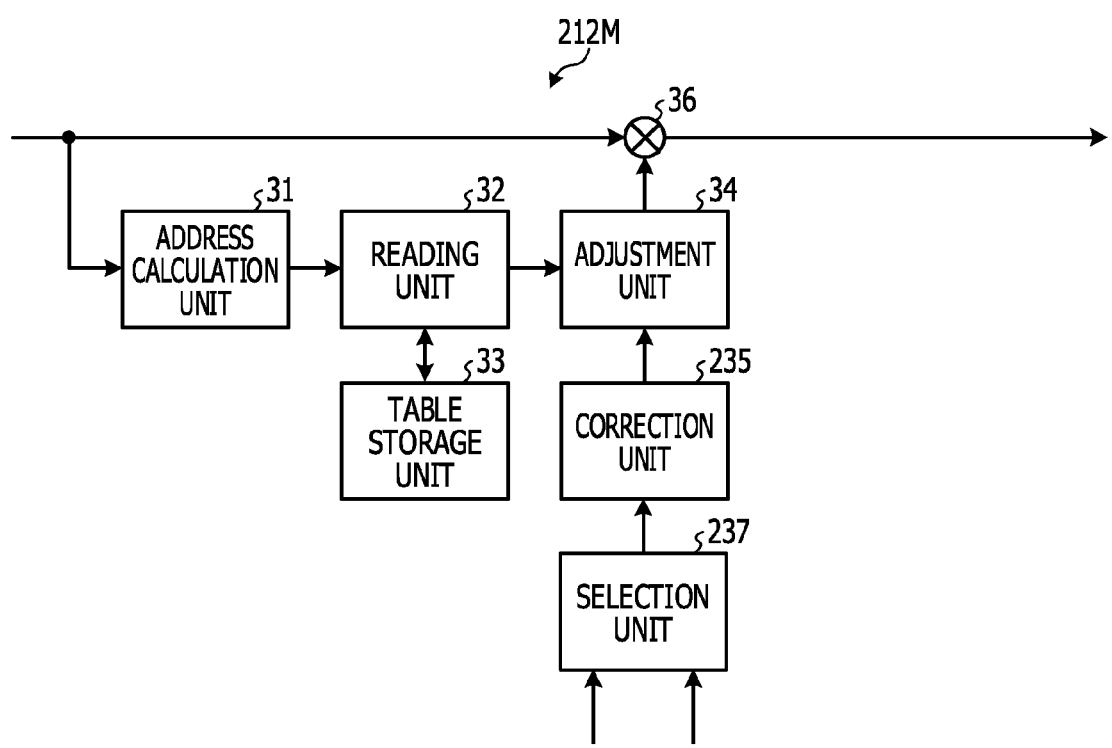
FIG. 22 is a block diagram illustrating an example of a distortion compensation device according to the sixth embodiment.

FIG. 22 is a block diagram illustrating an example of the distortion compensation device according to the sixth embodiment. In FIG. 22, the distortion compensation device 212M includes a selection unit 237.

The selection unit 237 selects one of a feedback signal from the communication device 250 (that is, a "feedback signal outside the device") and a feedback signal in the device, and outputs the selected signal to the correction unit 235. That is, the selection unit 237 performs switching between the feedback path outside the device and the feedback path in the device. The switching processing by the selection unit 237 may be executed similar to that of the selection unit 37 according to the fourth embodiment.

As described above, in the embodiment, the communication device 210M includes the feedback path in the device, in addition to the configuration similar to that of the communication device 210. In addition, in the distortion compensation device 212M, the selection unit 237 outputs, to the correction unit 235, a feedback signal sent back transmitted from the communication device 250 that has received a signal transmitted from the communication device 210, or a feedback signal in the device.

Due to such a configuration of the distortion compensation device 212M, even in the state in which the communication between the communication device 210M and the communication device 250 is not established, the adjustment coefficient may be corrected (updated).

Other Embodiments

The elements of the units described in the first embodiment to the sixth embodiment may not be configured as physically illustrated in the figures. That is, a specific form for division and integration of the units is not limited to the illustrated form, and all or some of the units may be functionally or physically divided or integrated in a certain unit in accordance with various loads, usage, and the like.

In addition, all or some of the various processing functions executed in the units may be executed on a central processing unit (CPU) (or a microcomputer such as a micro processing unit (MPU) or a micro controller unit (MCU)). In addition, all or some of the various processing functions may be executed on a program analyzed and executed by the CPU (or the microcomputer such as the MPU or the MCU), or on hardware by wired logic.

Each of the distortion compensation devices according to the first embodiment to the sixth embodiment may be achieved, for example, by the following hardware configuration.

Figure 23:
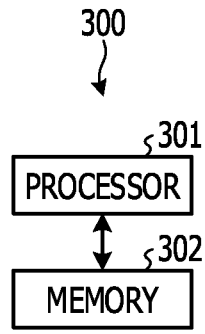
FIG. 23 is a diagram illustrating a hardware configuration example of a distortion compensation device.

FIG. 23 is a diagram illustrating a hardware configuration example of a distortion compensation device. As illustrated in FIG. 23, a distortion compensation device 300 includes a processor 301 and a memory 302. As an example of the processor 301, there are a CPU, a digital signal processor (DSP), a field programmable gate array (FPGA), and the like. In addition, as an example of the memory 302, there are a random access memory (RAM) such as a synchronous dynamic random access memory (SDRAM), a read only memory (ROM), a flash memory, and the like.

In addition, the various processing functions executed in the distortion compensation devices according to the first embodiment to the sixth embodiment may be achieved by causing the processor to execute programs stored in the various memories such as a nonvolatile storage medium. That is, programs corresponding to the pieces of processing executed by the address calculation unit 31, the reading unit 32, the adjustment unit 34, the correction units 35, 135, and 235, the multiplication unit 36, and the selection units 37, 137, and 237 are recorded to the memory 302, and each of the programs may be executed by the processor 301. In addition, the table storage unit 33 may be obtained by the memory 302.

As described above, the various processing functions executed in the distortion compensation devices according to the first embodiment to the sixth embodiment are executed by the single processor 301, but the embodiment is not limited to such an example, and the various processing functions may be executed by a plurality of processors.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless communication system configured to perform a closed-loop distortion compensation scheme, comprising:
   a first communication device including:
      a memory configured to store a plurality of distortion compensation coefficient sets, each of the plurality of distortion compensation coefficient sets including a plurality of distortion compensation coefficients for compensating distortion that occurs in signals amplified by an amplifier, each of the plurality of distortion compensation coefficient sets respectively corresponding to powers of the signals;
      a processor configured to:
      measure a power of an input signal,
      determine a distortion compensation coefficient set from the plurality of distortion compensation coefficient sets stored in the memory, based on the measured power of the input signal, and
      compensate the distortion to the input signal that is to be amplified by the amplifier, based on the determined distortion compensation coefficient set,
      the amplifier being configured to amplify the input signal to which the distortion is compensated, the input signal comprising a known signal having an amplitude corresponding to a nonlinear domain of the amplifier, and
      a first antenna configured to:
      transmit the amplified input signal to a second communication device, using a transmission band of the first communication device, and
      receive a first feedback signal from the second communication device, the first feedback signal being related to an error that is detected in a received signal by the second communication device, the received signal corresponding to the amplified input signal; and
   the second communication device including:
      a second antenna configured to:
      receive the transmitted input signal from the first communication device, and
      transmit the first feedback signal to the first communication device,
   wherein the plurality of distortion compensation coefficients included in the determined distortion compensation coefficient set in the first communication device are adjusted based on the first feedback signal relating to the error that is detected in the received signal by the second communication device.

2. The wireless communication system according to claim 1, wherein the error comprises a gap between the received signal by the second communication device and an expected received signal.

3. The wireless communication system according to claim 2, wherein the gap comprises a vector from a signal point of the expected received signal to a signal point of the received signal by the second communication device.

4. The wireless communication system according to claim 2, wherein the gap comprises a modulation error ratio based on a vector from a signal point of the expected received signal to a signal point of the received signal by the second communication device.

5. The wireless communication system according to claim 2, wherein the expected received signal comprises a signal point that is closest from a signal point of the received signal in a plurality of signal points used for a modulation scheme applied to the input signal.

6. The wireless communication system according to claim 1, wherein:
   the received signal comprises a plurality of received signals,
   a plurality of gaps are detected by the second communication device, each of the plurality of gaps being a gap between each of the plurality of received signals and each of a plurality of expected received signals for each of the plurality of received signals, and
   the error comprises a weighted average of the plurality of gaps with a plurality of weighting factors corresponding to the plurality of expected received signals, each of the weighting factors being large as a corresponding expected received signal is farther from an origin of constellation.

7. The wireless communication system according to claim 1, further comprising:
   a selector configured to select one of the first feedback signal and a second feedback signal that is feedbacked within the first communication device based on the amplified signal, and
   when the second feedback signal is selected, the plurality of distortion compensation coefficients included in the determined distortion compensation coefficient set are adjusted based on the second feedback signal.

8. The wireless communication system according to claim 1, wherein the error comprises an error rate of the received signal.

9. A distortion compensation device in a first communication device, the first communication device being configured to perform a closed loop distortion compensation scheme, the distortion compensation device comprising:
   a memory configured to store a plurality of distortion compensation coefficient sets, each of the plurality of distortion compensation coefficient sets including a plurality of distortion compensation coefficients for compensating distortion that occurs in signals amplified by an amplifier, each of the plurality of distortion compensation coefficient sets being respectively corresponding to powers of signals,
   a processor configured to:
   measure a power of an input signal,
   determine a distortion compensation coefficient set from the plurality of distortion compensation coefficient sets stored in the memory, based on the measured power of the input signal, and compensate the distortion to the input signal based on the determined distortion compensation coefficient set, the amplifier being configured to amplify the input signal to which the distortion is compensated, the input signal comprising a known signal having an amplitude corresponding to a nonlinear domain of the amplifier, and a first antenna configured to:

transmit the amplified signal to a second communication device, and receive a first feedback signal from the second communication device, the first feedback signal being related to an error that is detected in a received signal by the second communication device, the received signal corresponding to the amplified input signal, wherein the plurality of distortion compensation coefficients included in the determined distortion compensation coefficient set are adjusted based on the first feedback signal relating to the error that is detected in the received signal by the second communication device.

10. A distortion compensation method in a closed loop distortion compensation scheme, the distortion compensation method comprising:

at a first communication device:

storing a plurality of distortion compensation coefficient sets, each of the plurality of distortion compensation coefficient sets including a plurality of distortion compensation coefficients for compensating distortion that occurs in signals that are amplified by an amplifier, each of the plurality of distortion compensation coefficient sets being respectively corresponding to powers of signals;

measuring a power of an input signal;

determining a distortion compensation coefficient set from the plurality of distortion compensation coefficient sets stored in the memory, based on the measured power of the input signal;

compensating the distortion to the input signal based on the determined distortion compensation coefficient set;

amplifying the input signal to which the distortion is compensated, by the amplifier of the first communication device, the input signal comprising a known signal having an amplitude corresponding to a nonlinear domain of the amplifier;

transmitting the amplified input signal to a second communication device; and receiving a first feedback signal from the second communication device, the first feedback signal relating to an error that is detected in a received signal by the second communication device, the received signal corresponding to the transmitted, amplified input signal by the first communication device, wherein the plurality of distortion compensation coefficients included in the determined distortion compensation coefficient set are adjusted based on the first feedback signal relating to the error that is detected in the received signal by the second communication device.

* * * * *